(12) United States Patent
Ookoshi

(10) Patent No.: US 8,232,217 B2
(45) Date of Patent: Jul. 31, 2012

(54) FILM DEPOSITION APPARATUS, METHOD OF MANUFACTURING A SEMICONDUCTOR DEVICE, AND METHOD OF COATING THE FILM DEPOSITION APPARATUS

(75) Inventor: Katsuaki Ookoshi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 339 days.

(21) Appl. No.: 12/175,002

(22) Filed: Jul. 17, 2008

(65) Prior Publication Data
US 2009/0023301 A1 Jan. 22, 2009

(30) Foreign Application Priority Data
Jul. 19, 2007 (JP) ................................. 2007-188148

(51) Int. Cl.
*H01L 21/31* (2006.01)
(52) U.S. Cl. .................... 438/792; 257/E21.24; 427/569
(58) Field of Classification Search .................. 438/792; 257/E21.24; 427/569
See application file for complete search history.

(56) References Cited

U.S. PATENT DOCUMENTS

| 2005/0040033 A1* | 2/2005 | Liu et al. .................. 204/192.15 |
| 2006/0124058 A1 | 6/2006 | Sakai et al. |
| 2007/0090455 A1* | 4/2007 | Lim et al. ...................... 257/338 |
| 2009/0321936 A1* | 12/2009 | Kojima et al. ................ 257/751 |

FOREIGN PATENT DOCUMENTS

| JP | 02-021598 A | 1/1990 |
| JP | 2005-243737 A | 9/2005 |
| JP | 2006-279058 A | 10/2006 |

OTHER PUBLICATIONS

Office Action issued on Oct. 11, 2011 in corresponding Japanese Patent Application No. 2007-188148. Partial English translation.

* cited by examiner

*Primary Examiner* — Alexander Ghyka
*Assistant Examiner* — Stanetta Isaac
(74) *Attorney, Agent, or Firm* — Westerman, Hattori, Daniels & Adrian, LLP

(57) ABSTRACT

A method of manufacturing a semiconductor device has supplying a first reactant gas into buffer chamber provided in a reaction chamber of the film deposition apparatus to form a first film over an inner wall surface of the buffer chamber, and supplying a second reactant gas into the reaction chamber to form a second film over a semiconductor substrate.

9 Claims, 9 Drawing Sheets

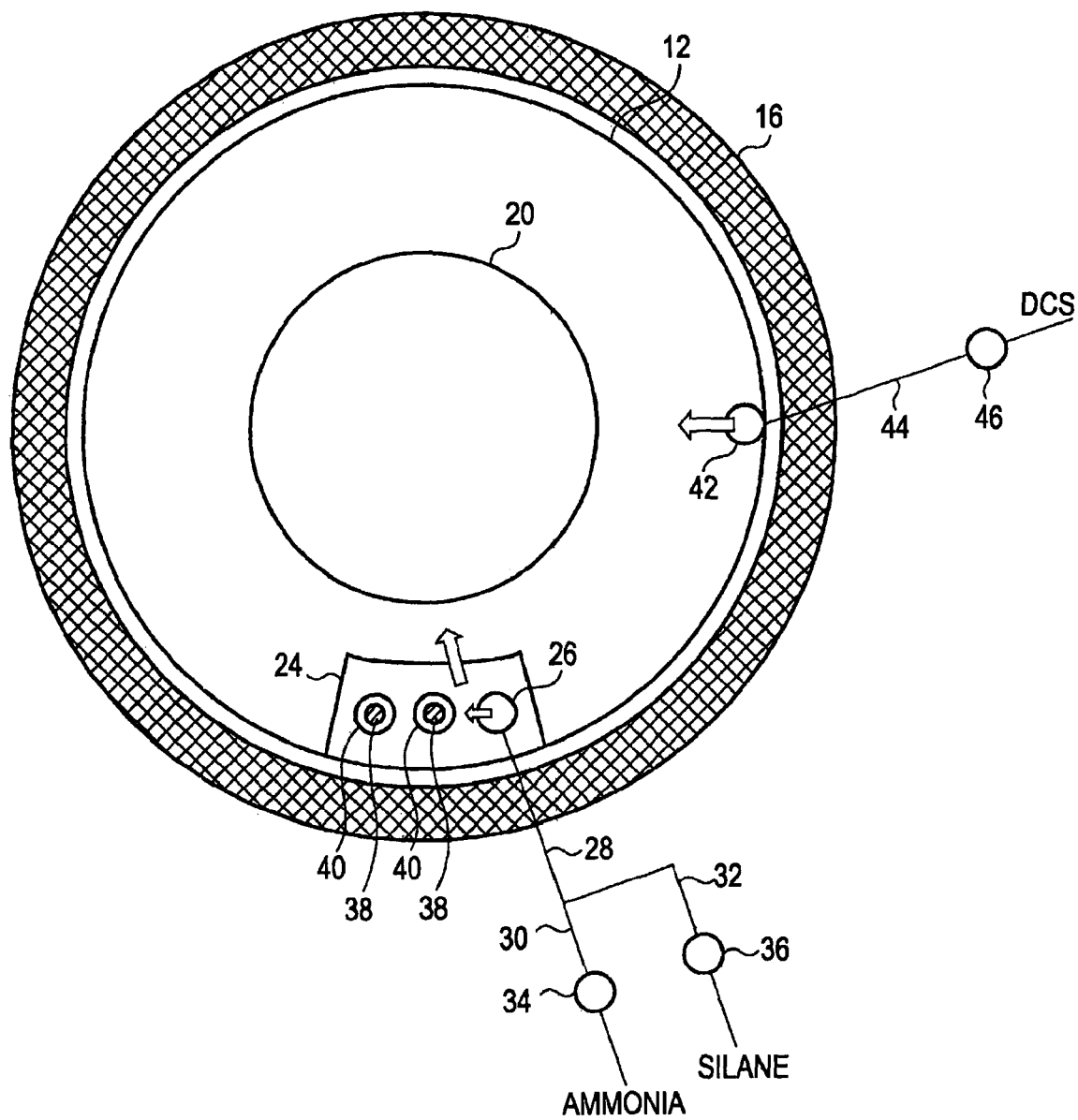

FILM DEPOSITION APPARATUS, METHOD OF MANUFACTURING A SEMICONDUCTOR DEVICE, AND METHOD OF COATING THE FILM DEPOSITION APPARATUS

CROSS-REFERENCE TO RELATED APPLICATIONS

This application is based upon and claims the benefit of priority from the prior Japanese Patent Application No. 2007-188148, filed on Jul. 19, 2007, the entire contents of which are incorporated herein by reference.

BACKGROUND OF THE INVENTION

The present invention relates to a film deposition apparatus that performs film deposition over a substrate, and to a method of manufacturing a semiconductor device.

The chemical vapor deposition (CVD) process is known as one film deposition technique of the techniques and processes used in the manufacturing process of semiconductor devices. With recent advancement in technology for miniaturization of semiconductor devices, such a film deposition technique is required to be capable of, for example, performing film deposition at low temperature and depositing thin films of high quality.

An atomic layer deposition (ALD) process has the features that film deposition can be implemented at low temperature and film deposition excellent in step-portion coating capability can be accomplished. In the ALD process, two or more different types of reactant gases to be used as source materials of a deposition target film are alternately supplied to a wafer substrate. The gases are adsorbed onto the surface of the substrate by one atomic layer or by one molecular layer, whereby film deposition is performed utilizing chemical reaction on the surface of the substrate.

FIG. 1 is a transverse cross sectional view showing the configuration of a conventional film deposition apparatus that performs film deposition by using the ALD process. The apparatus will be described with reference to an example case where a silicon nitride film is deposited.

In a reactor tube 100, a plurality of wafers 102 are arranged in a vertical direction at a predetermined pitch with the wafer surfaces directed in a horizontal direction.

A buffer chamber 104 is provided to an inner wall of the reactor tube 100. A nozzle 106 for supplying an ammonia gas, and a pair of electrodes 108 for generating plasma are disposed in the buffer chamber 104. The pair of electrodes 108, are respectively equipped in electrode protection tubes 110. The ammonia gas is activated by plasma generated by the pair of electrodes 108 in the buffer chamber 104, and is supplied to the wafers 102 through a gas supply opening 104a of the buffer chamber 104.

Separate from the buffer chamber 104, a gas supply section 112 for supplying a dichlorosilane (DCS) gas is provided. The DCS gas is supplied to the wafers 102 through a gas supply opening 112a in the gas supply section 112.

In film deposition, the activated ammonia gas from the buffer chamber 104 and supply of the DCS gas from the gas supply section 112 are alternately supplied, and the silicon nitride film is formed over the wafers 102.

In the conventional film deposition apparatus, quartz is used as a material for members, such as the buffer chamber, electrode protection tubes, nozzle, gas supply section, in the reactor tube, and for the reactor tube itself. Sodium and the like are contained as impurities in the members comprising quartz. When, during film deposition over the wafers, the plasma is generated in the reactor tube 100, the sodium and the like contained in the quartz member(s) are discharged and, as a consequence, are adsorbed into the film being deposited. When such sodium and the like thus discharged is included in a semiconductor device, deterioration of device properties results.

Generally, in a film deposition apparatus such as described above, an inner wall surface of a reactor receptacle and component members provided in the interior of the reactor receptacle are coated with a film deposited by the CVD process before film deposition over the wafers. The film coating is thus applied for the purposes of, for example, inhibition of contamination with impurities contained in the quartz members, inhibition of particle occurrence, and improvement of film deposition stability.

In a film deposition apparatus employing the ALD process, the inner wall surface of the reactor receptacle and the members in the interior of the reactor receptacle have to be coated with a film deposited by, for example, the CVD or ALD process as a treatment before film deposition over the wafers. In the example case described above, the inner wall surface of the reactor receptacle, the outer surface of the buffer chamber, and the surface of the gas supply section disposed in the exterior of the buffer chamber can be coated with the silicon nitride film.

However, the inner surface of the buffer chamber and the surfaces of the nozzles disposed interiorly of the buffer chamber are difficult to coat with the silicon nitride film. This is because, the reactant gas activated by the plasma discharges from the gas supply opening of the buffer chamber, and this discharge makes it difficult for the other gas, for example, DCS gas which has been supplied from the gas supply section in the exterior of the buffer chamber to flow into the buffer chamber.

SUMMARY

According to an aspect of the invention, a method of manufacturing a semiconductor device includes supplying a first reactant gas into a buffer chamber provided in a reaction chamber of a film deposition apparatus to form a first film over an inner wall surface of the buffer chamber, and supplying a second reactant gas into the reaction chamber to form a second film over a semiconductor substrate.

BRIEF DESCRIPTION OF THE DRAWINGS

FIG. 7 is a transverse cross sectional view showing the configuration of a film deposition apparatus of another further embodiment of the present invention.

PREFERRED EMBODIMENTS

First, the film deposition apparatus of the present embodiment will be described herein below with reference to FIGS. 2 and 3. The present embodiment will be described with reference to the case where a silicon nitride film is deposited using an ammonia gas and a DCS gas, respectively, as material gases. The ammonia gas is a reactant gas that has to be activated by plasma, and the DCS gas is a reactant gas that does not have to be activated by plasma.

Figure 2:
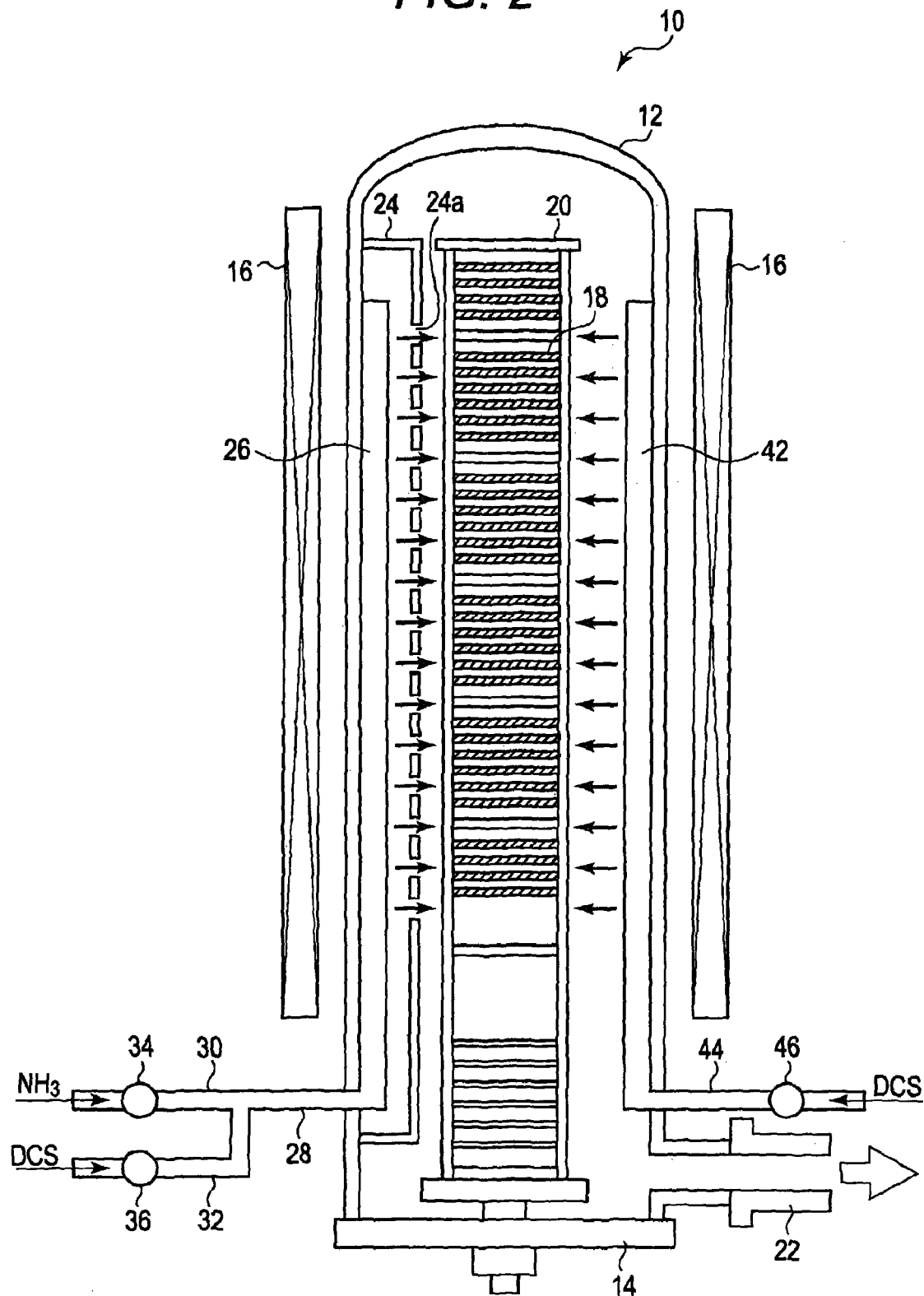
FIG. 2 is an elevational cross sectional view showing the configuration of a film deposition apparatus of an embodiment of the present invention.
Figure 3:
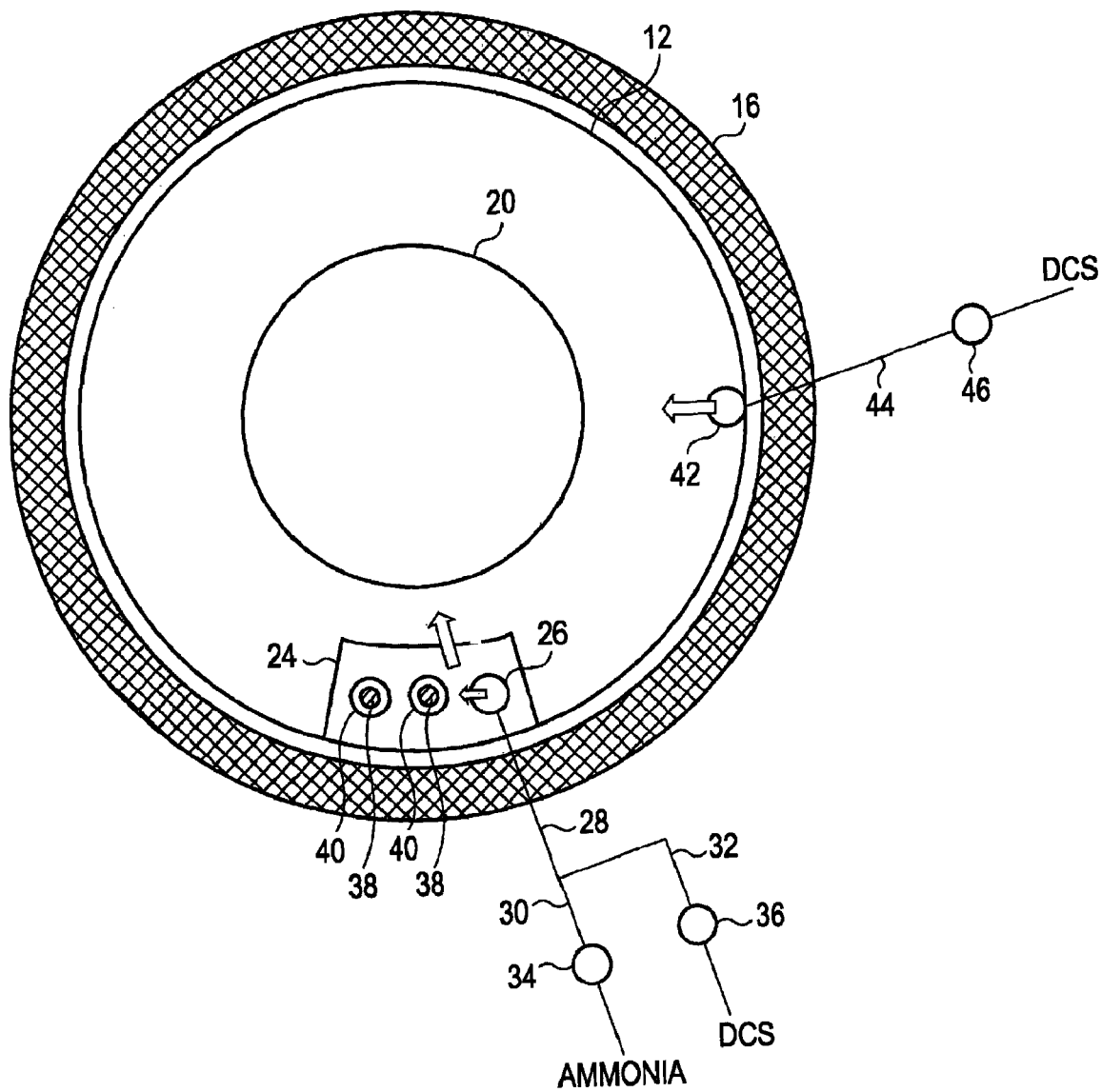
FIG. 3 is a transverse cross sectional view showing the configuration of the film deposition apparatus of the embodiment of the present invention.

With reference to FIGS. 2 and 3, the present embodiment includes a reactor tube 12 and a seal cap 14. The cylindrical reactor tube 12 includes an opening section at the lower end, and the seal cap 14 seals the opening section at the lower end of the reactor tube 12. The material of the reactor tube 12 includes quartz, for example. A seal member, such as an o-ring, is disposed between the lower end of the reactor tube 12 and the seal cap 14, and the opening section at the lower end of the reactor tube 12 is sealed by the seal cap 14.

A heater 16 for heating the reaction chamber 10 is provided around the reactor tube 12. During film deposition, multiple wafers 18 are heated by the heater 16.

A holding section 20 for holding the wafers 18 is provided above the seal cap 14 in the reactor tube 12. The multiple wafers 18 are held over the holding section 20 so that the wafer surfaces are directed in the horizontal direction on multiple stages along the direction of the tube axis.

A discharge opening 22 for discharging gases in the reactor chamber 10 is provided to the reactor tube 12. A vacuum pump is connected to the discharge opening 22.

A buffer chamber 24 is located on the inner wall of the reactor tube 12, for example, along the arrangement direction of the wafers 18 held by the holding section 20. The material of the buffer chamber 24 includes quartz, for example.

A shower nozzle 26 is provided in the buffer chamber 24. The shower nozzle 26 alternately supplies the ammonia gas and the DCS gas as reactant gases into the reaction chamber 10. The material of the shower nozzle 26 includes quartz, for example.

A gas supply conduit 28 is coupled to the shower nozzle 26. The gas supply conduit 28 branches to gas supply conduits 30 and 32 that supply the ammonia gas and the DCS gas, respectively. A valve 34 is provided to the gas supply conduit 30, in which the supply of the ammonia gas to the shower nozzle 26 is controlled by open and close operations of the valve 34. Similarly, a valve 36 is provided to the gas supply conduit 32, in which the supply of the DCS gas to the shower nozzle 26 is controlled by open and close operations of the valve 36. The ammonia gas and the DCS gas are thus alternately supplied to the shower nozzle 26.

The shower nozzle 26 is disposed, for example, along the arrangement direction of the wafers 18 held by the holding section 20. On the side of a pair of high frequency electrodes 38 also located in the inner portion of the buffer chamber 24, multiple gas injection orifices are provided, for example, along the arrangement direction of the wafers 18 held by the holding section 20. The gas injection orifices each have a size of several millimeters. As shown by arrows in FIG. 2, the reactant gas, that is, any one of the ammonia gas and the DCS gas, which is supplied to the shower nozzle 26 from the gas supply conduit 28, is injected from the multiple gas injection orifices.

As mentioned above, the pair of high frequency electrodes 38, which are used for discharging the plasma, are provided in the buffer chamber 24. The high frequency electrodes 38, respectively, extend in the direction, for example, along the shower nozzle 26, and are stored in electrode protection tubes 40. The material of the electrode protection tubes 40 includes quartz, for example. The plasma for activating the ammonia gas, which is injected from the shower nozzle 26, is generated when high frequency power is applied by a high frequency power source to the pair of high frequency electrodes 38.

Multiple gas injection orifices 24a for injecting the reactant gas stored in the buffer chamber 24 are provided, for example, along the arrangement direction of the wafers 18, which are held by the holding section 20, in a sidewall portion of the buffer chamber 24 on the side of the holding section 20. The multiple gas injection orifices 24a each have a size of several millimeters. The reactant gas supplied from the shower nozzle 26 into the buffer chamber 24 is injected toward the wafers 18 from the multiple gas injection orifices 24a.

The ammonia gas supplied from the shower nozzle 26 is activated in the buffer chamber 24 by the plasma generated by the pair of high frequency electrodes 38. The ammonia gas thus activated by the plasma is then injected toward the wafers 18 from the buffer chamber 24 via the multiple gas injection orifices 24a. The activation efficiency can be increased through the activation of the ammonia gas in the buffer chamber 24.

Further, a shower nozzle 42 is provided in a position outside of the buffer chamber 24 in the reaction chamber 10. The shower nozzle 42 is thus provided to supply the DCS gas as the reactant gas into the reaction chamber 10. The material of the shower nozzle 42 includes quartz, for example.

A gas supply conduit 44 for supplying the DCS gas is connected to the shower nozzle 42. A valve 46 is provided to the gas supply conduit 44. The supply of the DCS gas to the shower nozzle 42 is controlled by open and close operations of the valve 46.

The shower nozzle 42 is disposed, for example, along the arrangement direction of the wafers 18 held by the holding section 20. On the side of the holding section 20, the shower nozzle 42 includes multiple gas injection orifices.

As described further below, in the film deposition apparatus of the present embodiment, before the silicon nitride film is formed over the wafers 18, the process of supplying the ammonia gas from the shower nozzle 26 and the process of supplying the DCS gas from the shower nozzle 26 are alternately performed. This enables the silicon nitride film to be formed over the inner wall of the buffer chamber 24 through the ALD process using an ammonia gas and a DCS gas as material gases. The silicon nitride film may be deposited over surfaces of the interior portions of the reaction chamber 10 by alternately iterating the process of supplying the DCS gas into the reaction chamber 10 from the shower nozzle 42 and the process of supplying the ammonia gas into the reaction chamber 10 from the shower nozzle 26 via the buffer chamber 24.

Figure 4:
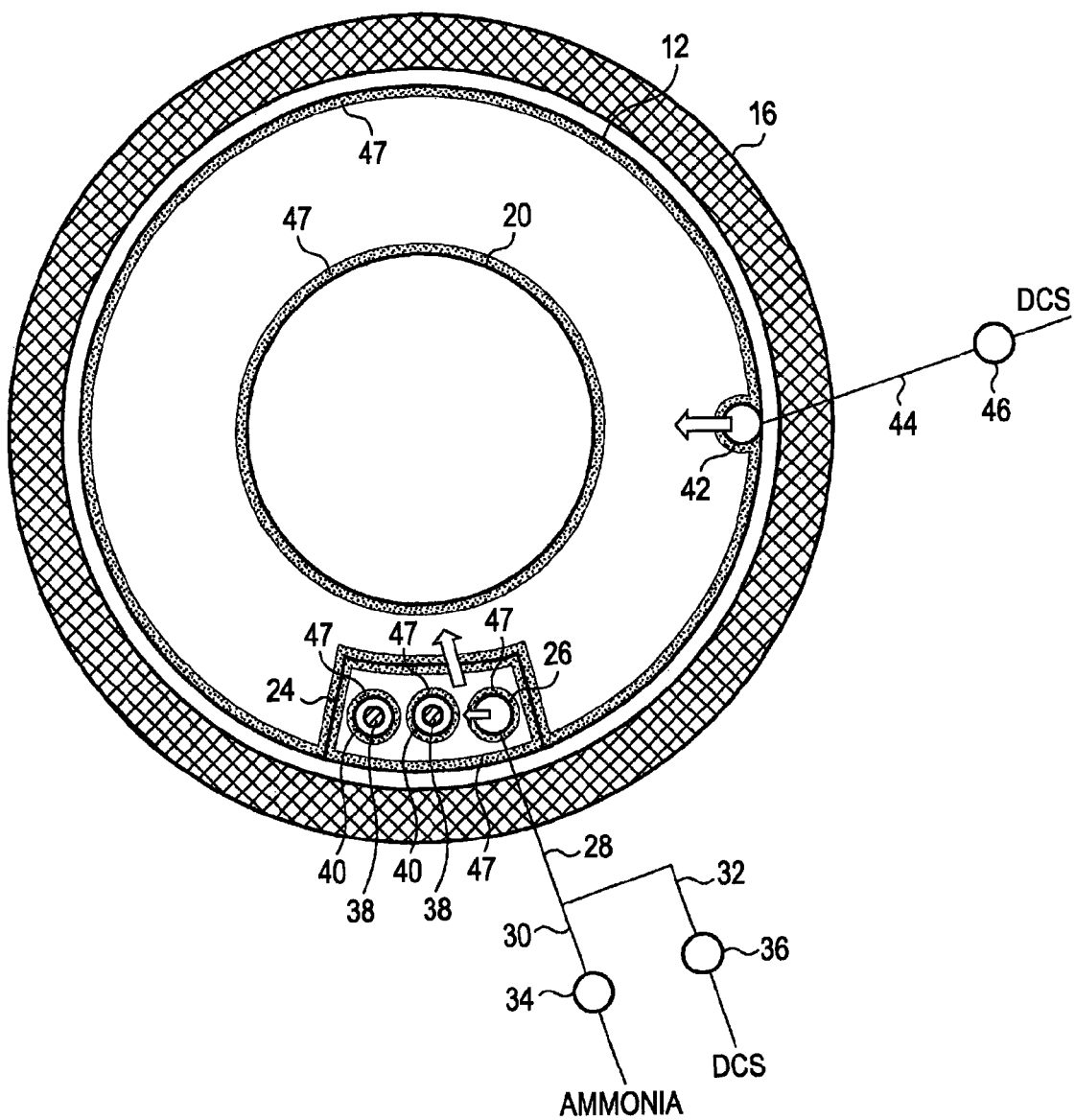
FIG. 4 is an explanatory view showing film deposition over surfaces of interior portions of a reaction chamber in the film deposition apparatus of the embodiment of the present invention.

FIG. 4 shows the state where the interior surfaces of the reaction chamber 10 are coated with a silicon nitride film 47 in the process before the silicon nitride film is deposited over the wafers 18.

More specifically, an inner wall surface of the reactor tube 12, a surface of the holding section 20, an outer surface of the buffer chamber 24, and a surface of the shower nozzle 42 are coated with the silicon nitride film 47. Further, in the present embodiment, not only the ammonia gas but also the DCS gas can be supplied into the buffer chamber 24. As such, an inner surface of the buffer chamber 24, a surface of the electrode protection tube 40, and an outer surface of the shower nozzle 26 are also coated with the silicon nitride film 47.

A coating method of coating the surfaces of the interior portions of the reaction chamber 10 will be described herein below. In the present embodiment, the silicon nitride film is formed over the surfaces of the interior portions of the reaction chamber 10 before the silicon nitride film is deposited over the wafers 18.

First, the reaction chamber 10 is heated by the heater 16, and the interior pressure of the reaction chamber 10 is reduced.

Then, high frequency power is applied between the pair of high frequency electrodes 38 located in the buffer chamber 24, to thereby generate the plasma.

Then, supplying the ammonia gas from the shower nozzle 26 in the buffer chamber 24 and supplying the DCS gas from the shower nozzles 26 and 42 are alternately performed. The ammonia gas supplied from the shower nozzle 26 is activated by the plasma, and the ammonia gas thus activated by the plasma is supplied into the reaction chamber 10 via the buffer chamber 24. The DCS gas supplied from the shower nozzle 26 is supplied into the reaction chamber 10 via the buffer chamber 24.

The timing of generating the plasma may be limited to the timing with which the ammonia gas is supplied from the shower nozzle 26.

In addition, in the event of forming the silicon nitride film over the surfaces of the interior portions of the reaction chamber 10, the ammonia gas does not necessarily have to be activated by the plasma when the temperature of the reaction chamber 10 is 500° C. or more.

In this manner, after the surfaces of the interior portions of the reaction chamber 10 are coated with the silicon nitride film, the silicon nitride film is deposited over the wafers 18.

First, the multiple wafers 18 are arranged in the holding section 20 in the reaction chamber 10.

Then, the wafers 18 in the reaction chamber 10 are heated by the heater 16, and the interior pressure of the reaction chamber 10 is reduced.

Then, the high frequency power is applied between the pair of high frequency electrodes 38, thereby to generate the plasma.

Then, supplying the ammonia gas from the shower nozzle 26 and supplying the DCS gas from the shower nozzle 42 are alternately performed. The ammonia gas thus supplied is activated by the plasma, and is then injected into the reaction chamber 10 through the gas injection orifices 24a of the buffer chamber 24. The DCS gas is injected toward the wafers 18 from the gas injection orifices of the shower nozzle 42. In this case, the DCS gas may be supplied from one or both of the shower nozzle 42 and the shower nozzle 26.

The timing of generating the plasma may be limited to a timing with which the ammonia gas is supplied from the shower nozzle 26.

The results of evaluation of silicon nitride films deposited using the deposition apparatus of the present embodiment will now be described below with reference to FIG. 5.

Figure 5:
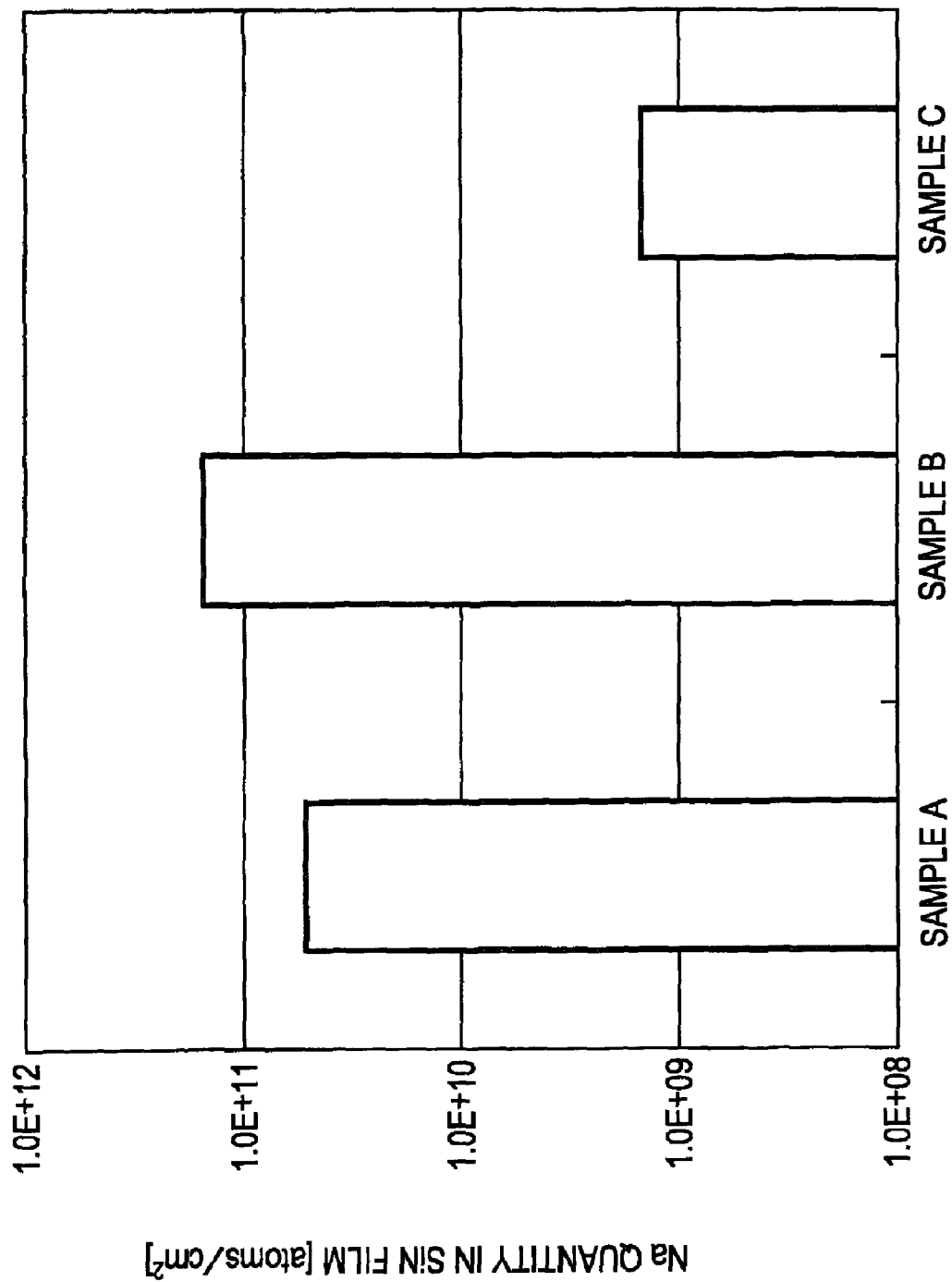
FIG. 5 is a graph showing the results of evaluation of silicon nitride films deposited over wafers by the film deposition apparatus of the embodiment of the present invention.

FIG. 5 is a graph showing the results of measurement of the quantities of sodium contained in the silicon nitride films deposited over the wafers. In this case, the measurement was performed by using an inductively coupled plasma-mass spectrometry (ICP-MS).

The sample C was prepared by using the deposition apparatus of the present embodiment in the manner as described above. More specifically, surfaces of interior portions of the reactor tube 12 and the surfaces of the interior portions of the buffer chamber 24 are coated with the silicon nitride film, and then the silicon nitride film was deposited over the sample wafer with the wafer temperature set to 530° C.

The sample A was prepared in the manner that the silicon nitride film was not deposited over surfaces of interior portions of the buffer chamber 24, and the silicon nitride film was deposited over the sample wafer with the wafer temperature set to 450° C.

The sample B was prepared in the manner that the silicon nitride film was not deposited over the surfaces of the interior portions of the buffer chamber 24, and the silicon nitride film was deposited over the sample wafer with the wafer temperature set to 530° C.

As shown in FIG. 5, it can be known that the sample C has a sodium quantity in the silicon nitride film significantly reduced relative to the respective sample A and B.

A film deposition apparatus of another embodiment of the present invention will be described with reference to FIG. 6.

Figure 6:
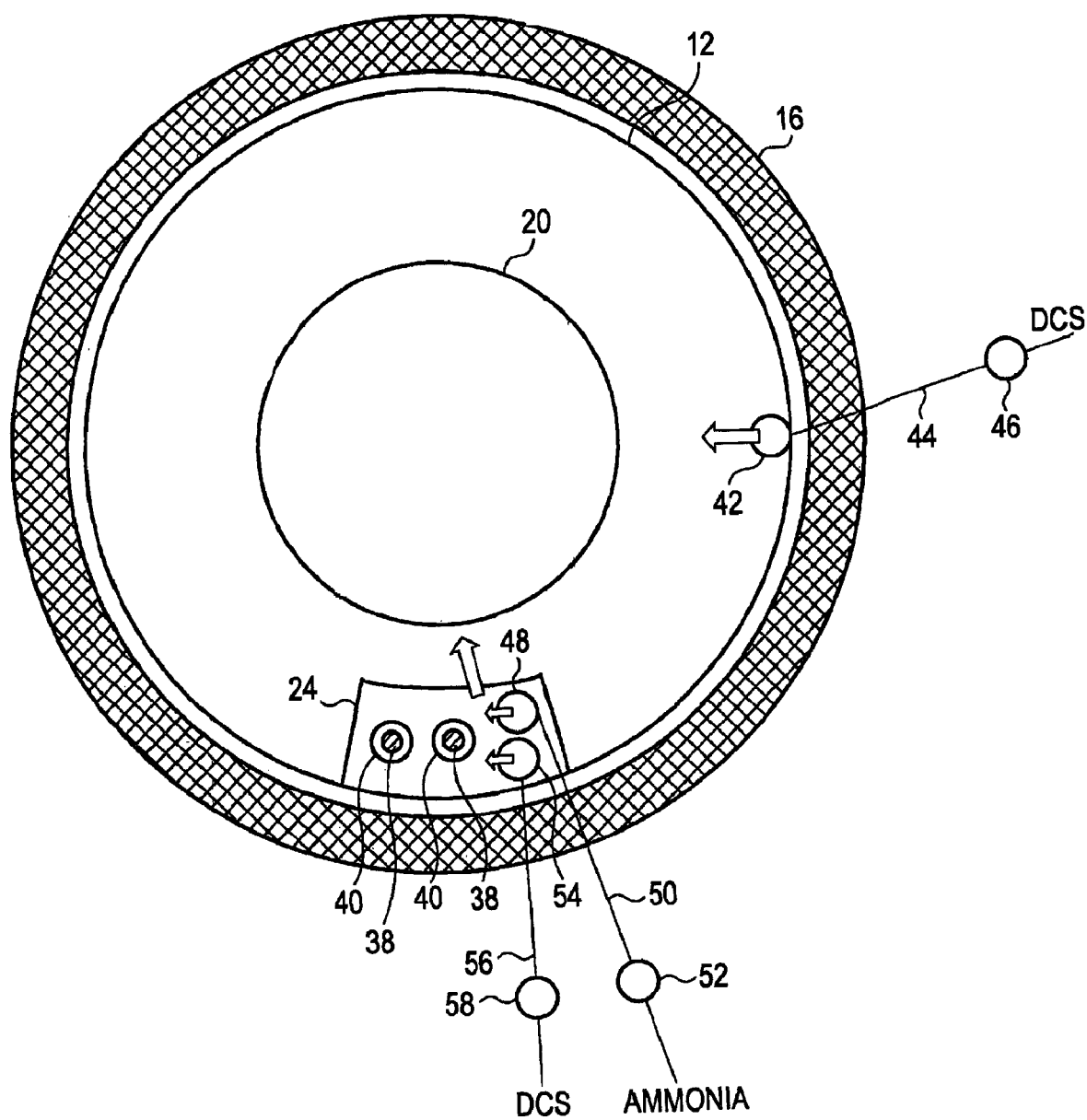
FIG. 6 is a transverse cross sectional view showing the configuration of a film deposition apparatus of another embodiment of the present invention.

A film deposition apparatus shown in FIG. 6 has a configuration in which the ammonia gas and the DCS gas, respectively, are supplied into the buffer chamber 24 from shower nozzles 48 and 54 provided independent of one another in the buffer chamber 24.

As shown in FIG. 6, the shower nozzle 48 for supplying the ammonia gas into the reaction chamber 10 is provided in the interior of the buffer chamber 24. A gas supply conduit 50 for supplying the ammonia gas is connected to the shower nozzle 48. A valve 52 is provided to the gas supply conduit 50, in which the supply of the ammonia gas to the shower nozzle 48 is controlled by the open and close operations of the valve 52.

The shower nozzle 54 for supplying the DCS gas is further provided in the buffer chamber 24. A gas supply conduit 56 for supplying the DCS gas is connected to the shower nozzle 54. A valve 58 is provided to the gas supply conduit 56, in which the supply of the DCS gas to the shower nozzle 54 is controlled by the open and close operations of the valve 58.

In the film deposition apparatus shown in FIG. 6, before deposition of the silicon nitride film over the wafers 18, supplying the ammonia gas from the shower nozzle 48 and supplying the DCS gas from the shower nozzle 54 and the shower nozzle 42 are alternately performed. Thereby, the silicon nitride film is deposited over the surfaces of the interior portions of the buffer chamber 24.

A film deposition apparatus of a further embodiment of the present invention will be described herein below.

Figure 1:
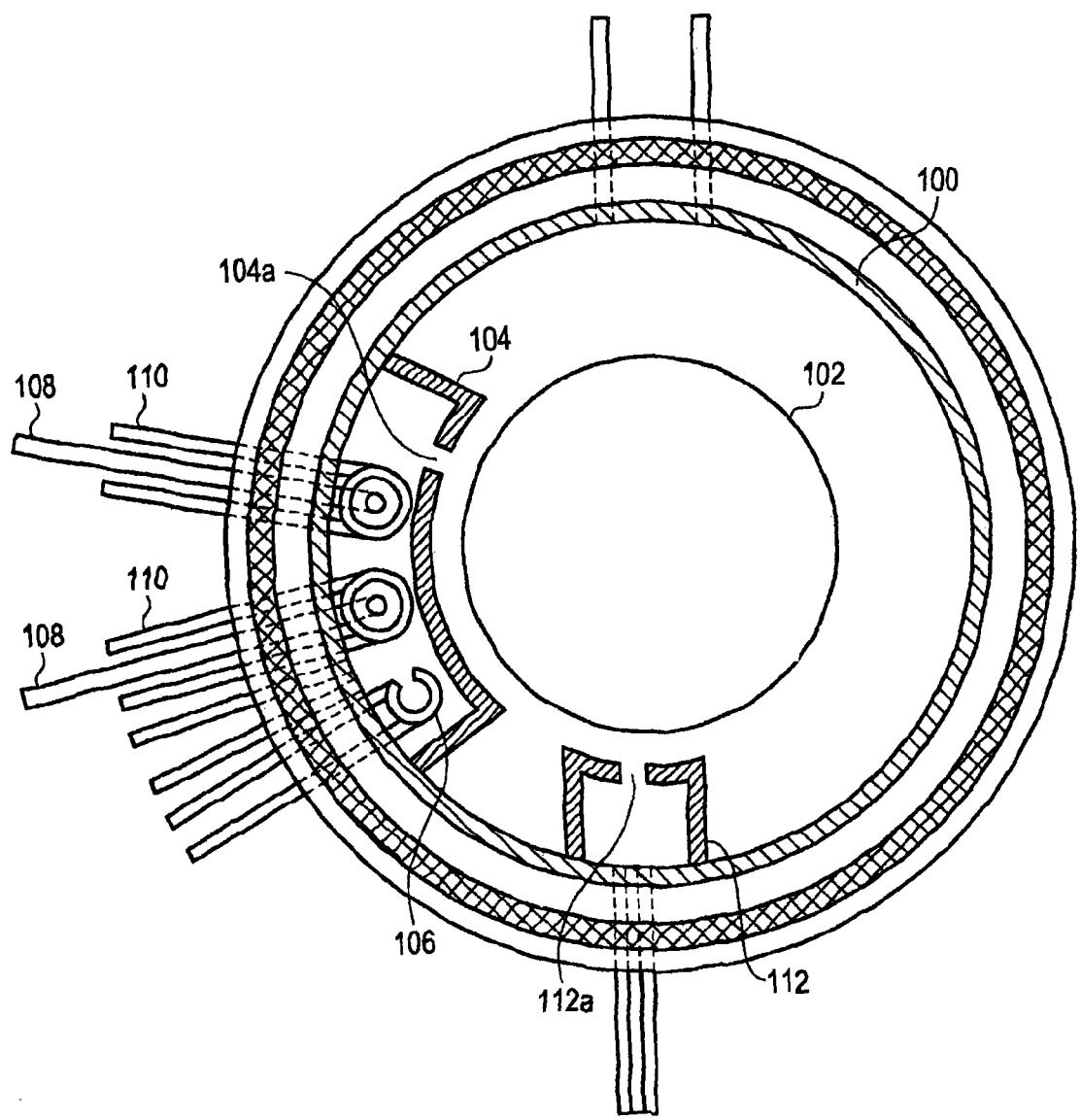
FIG. 1 is a transverse cross sectional view showing the configuration of a conventional film deposition apparatus.

In regard to the apparatus shown in FIG. 1, the configuration is shown and described in which the ammonia gas and the DCS gas are alternately supplied to the shower nozzle 26. However, as shown in FIG. 7, a silane gas may be supplied thereto instead of the DCS gas. In this case, a silicon-based film can be deposited over the surfaces of the interior portions of the buffer chamber 24 using a silane gas as a reactant gas. In this case, the silicone film is any one of a polysilicon film and an amorphous silicon film.

After the surfaces of the interior portions of the reaction chamber 10 inclusive of the surfaces of the interior portions of the buffer chamber 24 have been coated with the silicon-based film, the silicon nitride film is deposited over the wafers 18 using the ammonia gas and the DCS gas as the material gases.

In the configuration shown in FIG. 7, the ammonia gas and the silane gas are alternately supplied into the buffer chamber 24 from the single shower nozzle 26 provided in the buffer chamber 24. However, the ammonia gas and the silane gas do not necessarily have to be supplied from the single shower nozzle 26. Similarly as the configuration shown in FIG. 6, the configuration of FIG. 7 may be such that the ammonia gas and the silane gas are supplied into the buffer chamber 24 from shower nozzles provided independent of one another in the buffer chamber 24.

FIGS. 8A to 8F are in-process cross sectional views showing a method of manufacturing a semiconductor device.

A case in which a silicon nitride film 72 is formed over sidewall portions of a gate electrode 66 of a metal-insulator semiconductor (MIS) transistor by use of the film deposition apparatuses shown in any one of FIGS. 3, 6, and 7 will be described herein below.

Figure 8A:
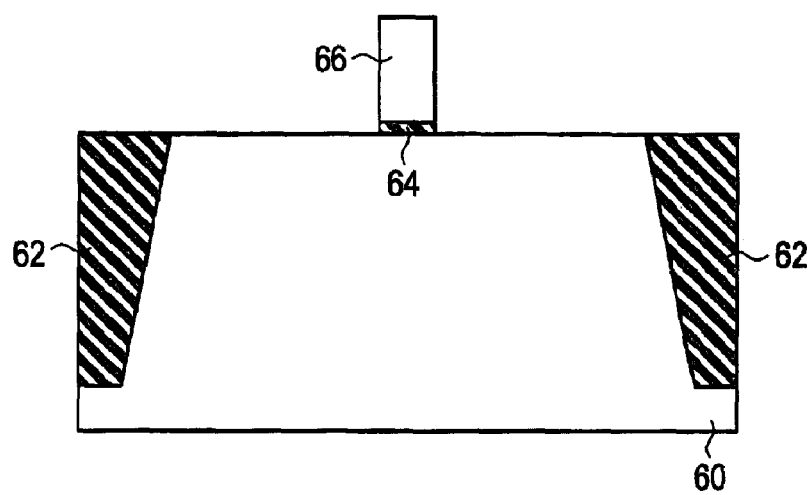
FIGS. 8A to 8F are step-wise cross sectional views a semiconductor device manufacturing method of one embodiment of the present invention.

With reference to FIG. 8A, device isolation regions 62 are formed in a semiconductor substrate 60 formed of, for example, silicon, by using a process such as a shallow trench isolation (STI) process. Then, a gate insulation film 64 formed of, for example, a silicon oxide film is formed over the semiconductor substrate 60 by using a process such as a thermal oxidization process.

Then, for example, a polysilicon film is deposited over the gate insulation film 64 by the CVD process, and the polysilicon film is patterned. Thereby, a gate electrode 66 is formed.

Figure 8B:
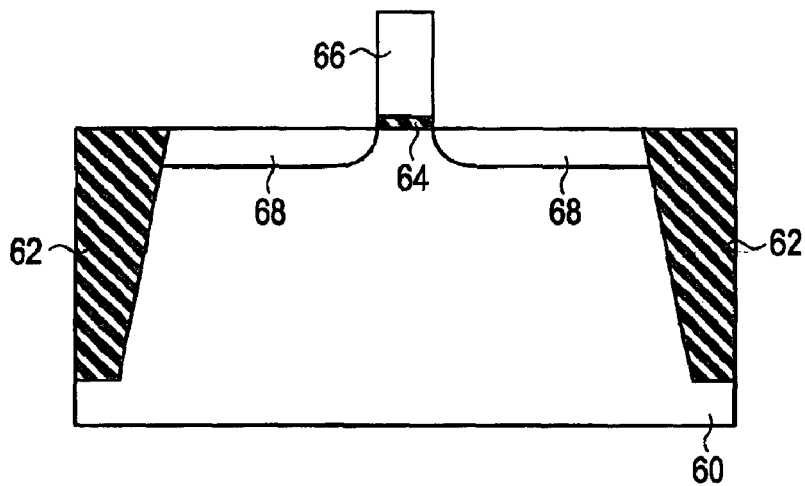

Then, with reference to FIG. 8B, impurity materials are implanted into the semiconductor substrate 60 at both sides of the gate electrode 66 with the gate electrode 66 being used as a mask by using, for example, an ion implantation process. Thereby, impurity diffusion regions 68, which are extension regions, are formed.

Figure 8C:
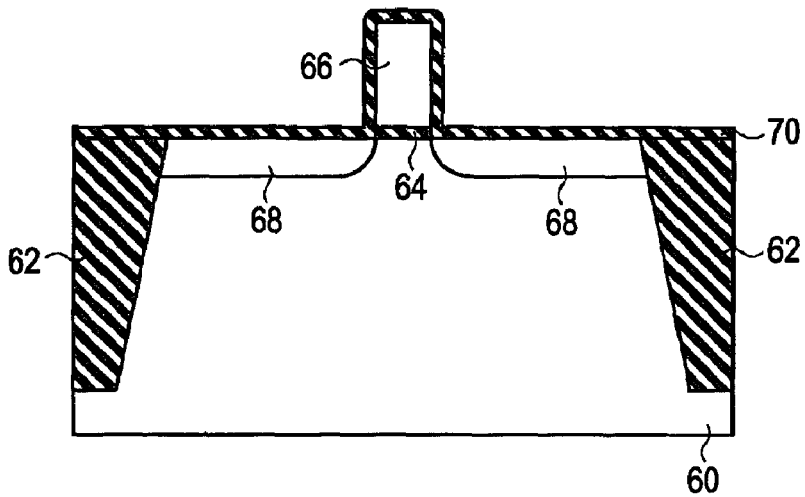

Subsequently, with reference to FIG. 8C, a silicon oxide film 70 is formed over the overall surface by the CVD process, for example.

Figure 8D:
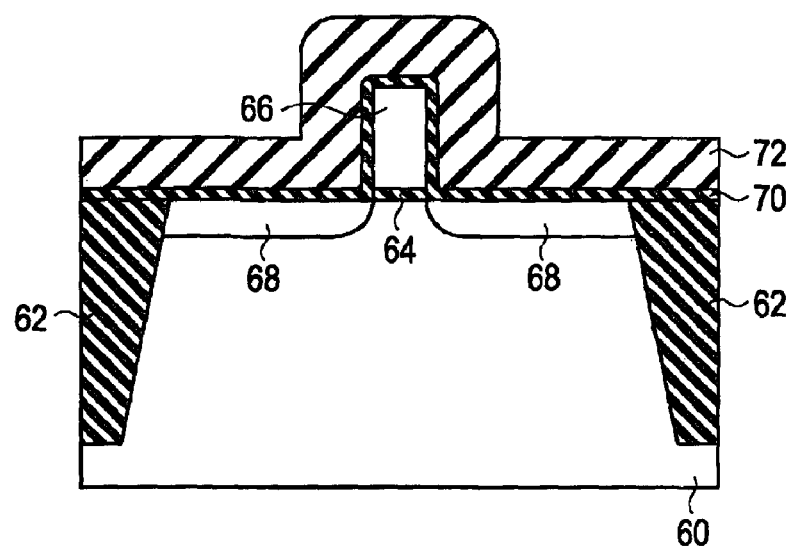

Subsequently, with reference to FIG. 8D, the silicon nitride film 72 is deposited over the silicon oxide film 70 by use of the film deposition apparatus shown in any one of FIGS. 3, 6, and 7.

In this case, as described above, before deposition of the silicon nitride film 72 over the silicon nitride film 72 by the ALD process, the silicon nitride film is deposited over surfaces of the interior portions of the reaction chamber 10 inclusive of the surfaces of the interior portions of the buffer chamber 24.

Figure 8E:
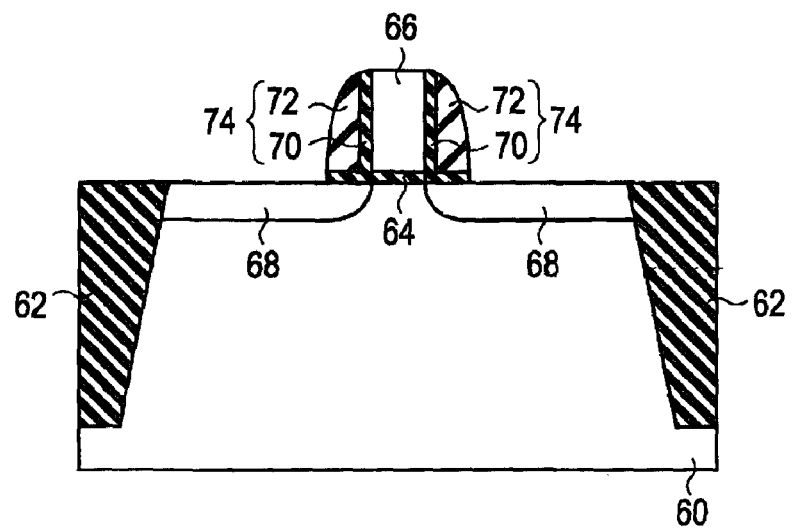

Subsequently, with reference to FIG. 8E, anisotropic etching of the silicon nitride film 72 and the silicon oxide film 70 is performed by, for example, a reactive ion etching (RIE) process. Thereby, sidewall spacers 74 inclusive of the silicon oxide film 70 and the silicon nitride film 72 are formed over the sidewall of the gate electrode 66.

Then, by use of the gate electrode 66 and the sidewall spacers 74 as masks, impurity materials are implanted into the semiconductor substrate 60 at both sides of the gate electrode 66 and the sidewall spacers 74 by using the ion implantation process, for example. Thereby, impurity diffusion regions 76, which will form source/drain regions, are formed.

Figure 8F:
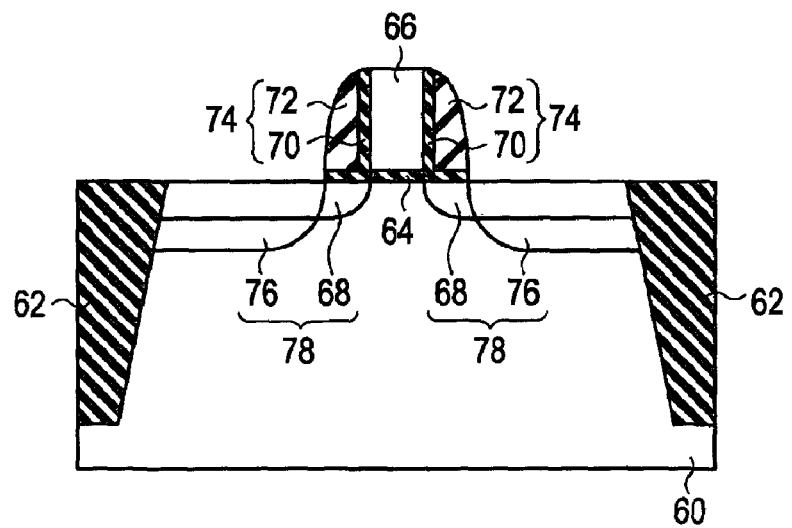

Subsequently, with reference to FIG. 8F, the impurity diffusion regions 68 and 76 are applied to a heat treatment, thereby to activate impurities contained in the impurity diffusion regions 68 and 76.

Thus, according to the present embodiment, as the insulation film, which constitutes the sidewall spacers 74, the silicon nitride film 72 is formed by using the film deposition apparatus shown in any one of FIGS. 3, 6, and 7.

The present invention is not limited to the embodiments described above, but can be enforced in various modified embodiments.

For example, while each of the embodiments has been described with reference to the example case of deposition of the silicon nitride film, the present invention is adaptable to the case of deposition of various other films.

For example, the present invention can be adapted even in the case of deposition of an aluminum oxide film.

As material gases in the case of deposition of the aluminum oxide film, an oxygen gas, which is a reactant gas necessary to be activated by the plasma, and a trimethylaluminum gas which is a reactant gas unnecessary to be activated by the plasma, are used.

Even in this case, the configuration of the film deposition apparatus is formed as in the FIGS. 3, 6, and 7 to make it possible to supply the oxygen gas and the trimethylaluminum into the buffer chamber 24. In this case, in the process of coating the surfaces of the interior portions of the reaction chamber 10, which process is performed as the process of pre-deposition over the wafers 18, coating are applied over the surfaces of the interior portions of the reaction chamber 10 inclusive of the surfaces of the interior portions of the buffer chamber 24.

Alternatively, the film deposition apparatus may be configured similarly as that of FIG. 7 to supply the silane gas into the buffer chamber 24. In this case, in the process of coating the surfaces of the interior portions of the reaction chamber 10, which process is performed as the process of pre-deposition over the wafers 18, the silicon-based film is deposited over the surfaces of the interior portions of the reaction chamber 10 inclusive of the surfaces of the interior portions of the buffer chamber 24. In this case, the silicon-based film is deposited by the CVD process with the silane gas being used as a material gas.

Further, in conjunction with FIGS. 3 and 6, description has been made referring to the example case of using the DCS gas as the reactant gas, which acts as a silicon source of the silicon nitride film. However, any one of gases other than the DCS gas, such as a hexadichlorosilane gas, tetrachlorosilane gas, and bis-tertiary-butylaminosilane gas, may be used, for example. In addition, while each of the embodiments has been described with reference to the example case where the ammonia gas is used as the reactant gas, which acts as a nitrogen source of the silicon nitride film, any one of gases other than the ammonia gas, such as a hydrazine gas, may be used, for example.

Further, in conjunction with FIG. 7, the embodiment has been described with reference to the example case in which, in the event of coating the surfaces of the interior portions of the reaction chamber 10 with the silicon-based film, the silane gas is supplied from the shower nozzle 26 in the buffer chamber 24. However, the deposition may be performed in the following manner. Instead of the silane gas, any one of silane-based gases, such as a disilane gas, hexadichlorosilane gas, trisilane gas, tetrachlorosilane gas, dichlorosilane gas, and bis-tertiary-butylaminosilane gas is supplied from the shower nozzle 26 in the buffer chamber 24. Then, the silicon-based film is deposited over the surfaces of the interior portions of the reaction chamber 10 by using the CVD process with the silane-based gas as a material gas. Thereby, the surfaces of the interior portions of the reaction chamber 10 inclusive of the surfaces of the interior portions of the buffer chamber 24 are coated with the silicone-based film.

Further, in conjunction with FIGS. 8A to 8F, the example case has been described in which the silicon nitride film is formed by the ALD process as the insulation film of the sidewall spacers by use of the film deposition apparatus shown in any one of FIGS. 3, 6 and 7. However, the present invention may be adapted also to deposition of, for example, an interlayer insulation film, an anti-diffusion film, and an etching stopper film.

Further, the present invention can be adapted not only to a so-called "vertical-batch type film deposition apparatus,"

which processes multiple wafers in batch, but also to a so-called "single-wafer type film deposition apparatus."

Further, the present invention can be adapted not only to the case of film deposition over the wafers, but also to the case of film deposition over various substrates or base plates, such as glass plates.

What is claimed is:

1. A method of manufacturing a semiconductor device, the method using a film deposition apparatus including a reaction chamber, a buffer chamber provided in the reaction chamber, a first gas supply section supplying a first reactant gas and a second reactant gas different from the first reactant gas into the buffer chamber, a second gas supply section supplying a third reactant gas into the reaction chamber, and a plasma generator generating plasma in the buffer chamber, wherein the method comprises:

supplying the first reactant gas and the second reactant gas into the buffer chamber through the first gas supply section to form a first film over an inner wall surface of the buffer chamber;

after forming the first film, setting a semiconductor wafer into the reaction chamber; and after setting the semiconductor wafer into the reaction chamber, supplying the first reactant gas into the buffer chamber through the first gas supplying section and supplying the third reactant gas into the reaction chamber through the second gas supplying section, thereby to form a second film over the semiconductor substrate.

2. The method according to claim 1, wherein the semiconductor substrate includes a gate electrode, wherein the method further comprises:

etching the second film to form sidewall spacers over sidewalls of the gate electrode after forming the second film.

3. The method according to claim 1, wherein the second film is formed by alternately supplying the first reactant gas and the third reactant gas into the reaction chamber.

4. The method according to claim 1, wherein the first film is formed by alternately supplying the first reactant gas and the second reactant gas into the buffer chamber.

5. The method according to claim 1, wherein the first reactant gas includes an ammonia gas, and the second film includes a silicon nitride film.

6. The method according to claim 1, wherein the first film includes any one of a silicon nitride film and a silicon film.

7. The method according to claim 1, wherein the first film is formed while the plasma is being generated by the plasma generator.

8. The method according to claim 7, wherein the first film is formed by alternately supplying the first reactant gas into the buffer chamber while causing the plasma generator to generate the plasma and supplying the second reactant gas into the buffer chamber.

9. The method according to claim 1, wherein the first reactant gas is ammonia and the second reactant gas is dichlorosilane.

* * * * *